United States Patent [19]

Banerjee et al.

[11] Patent Number: 4,829,471
[45] Date of Patent: May 9, 1989

[54] DATA LOAD SEQUENCER FOR MULTIPLE DATA LINE SERIALIZER

[75] Inventors: Pradip Banerjee, Sunnyvale; Paul D. Keswick, San Jose, both of Calif.

[73] Assignee: Advanced Micro Devices, Inc., Sunnyvale, Calif.

[21] Appl. No.: 827,839

[22] Filed: Feb. 7, 1986

[51] Int. Cl.[4] .................... G06F 12/00; G06F 13/00; G11C 7/00
[52] U.S. Cl. ............................. 364/900; 365/189.05
[58] Field of Search ... 364/200 MS File, 900 MS File; 365/196, 205, 207, 221, 239, 240, 189, 230

[56] References Cited

U.S. PATENT DOCUMENTS

| | | | |
|---|---|---|---|
| 4,330,852 | 5/1982 | Redwich et al. | 365/205 |
| 4,347,587 | 8/1982 | Rao | 365/221 |
| 4,397,003 | 8/1983 | Wilson et al. | 365/205 |
| 4,412,313 | 10/1983 | Ackland et al. | 365/205 |
| 4,525,849 | 6/1985 | Wolf | 365/221 |
| 4,644,502 | 2/1987 | Kawashima | 365/240 |
| 4,667,313 | 5/1987 | Pinkham et al. | 365/221 |
| 4,680,738 | 7/1987 | Tam | 365/239 |
| 4,733,376 | 5/1988 | Ogawa | 365/221 |

*Primary Examiner*—Gareth D. Shaw
*Assistant Examiner*—Joseph T. Fitzgerald
*Attorney, Agent, or Firm*—Fliesler, Dubb, Meyer & Lovejoy

[57] ABSTRACT

A data load serializer for use in conjunction with a multi-stage, multiple parallel data channel serializer is described. Each data channel of the data serializer preferably includes a data sensing stage and a data latching stage. The serializer is preferably responsive to the provision of an address for selecting data from the main buffer memory for provision to the serial buffer memory and further preferably includes sequencer control logic for receiving the main buffer memory address and for directing the transfer of data between the main and serial buffer memories and an address counter for receiving a start location address referencing a beginning serial data buffer memory location of the storage of data sourced to or from the data serializer. The sequencer control logic provides for the selection of respective data from the serial data buffer for each of the parallel data channels and enables the parallel sensing and latching of the respectively selected data in preparation for sourcing from the data serializer.

14 Claims, 5 Drawing Sheets

DATA LOAD SEQUENCER FOR MULTIPLE DATA LINE SERIALIZER

FIELD OF THE INVENTION

The present invention generally relates to the operation and control of high speed data serializers and, in particular, to a data load sequencer for rapidly loading data into high performance, multiple data line serializers, particularly those employing multiple parallel data channels, so as to minimize the time required for providing new valid data at the output of the data serializer following the initiation of a serializer data load cycle.

BACKGROUND

A wide variety of data serializer architectures are utilized in various high speed serial applications including video, telecommunications, recording and others. As the speed requirements that must be met by data serializers have increased, the corresponding serializer architectures have likewise increased in complexity. Such complexities typically include the use of a serial buffer memory for the temporary storage of data apart from a main buffer memory. Use of a serial data buffer memory allows the sourcing of serial data to or from the data serializer substantially independent of any memory access activity directed to the main buffer memory by a host processor. Data is transferred between the serial and main buffer memories periodically in a parallel data "burst" within a parallel data load cycle.

Although a data serializer is typically closely coupled to its serial data buffer memory, a critical performance limitation is the delay from the initiation of a data load cycle transferring new data to the serial buffer memory and the subsequent realization of the first of this new data at the serial output of the data serializer. In typical applications, this delay would define the maximum frequency that serial data can be uniformly sourced by the data serializer or, alternately, the refresh delay period between high frequency data bursts. In either case, it is naturally desirable to decrease this data load cycle initiation to first new data availability delay.

A number of exemplary data serializers are shown in and described in "High Speed, Ram Based Data Serializers", allowed U.S. patent application Ser. No. 805,164, filed Dec. 4, 1985 and assigned to the assignee of the present application. In particular, a dual data line serializer is shown and described. In order to increase the rate that data is sourced from the data serializer, parallel data channels are utilized to obtain respective data from a serial data buffer memory for sourcing during alternate source clock cycles. This effectively allows each data channel two source clock cycles to obtain and present a respective data for sourcing from the serializer. Consequently, a peak data source frequency of approximately twice that of more conventional data serializers is realized.

Unfortunately, each data channel of the dual data line serializer includes a number of sequentially operating address and data stages. Consequently, in a data load cycle providing new data to the serial data buffer memory, the delay to first new data available period is effectively extended by about two additional source clock cycles in order to fully load both serial data channels of the dual data line serializer. If further parallel data channels are utilized, additional clock cycle equivalents to the transfer delay period would likely be required.

SUMMARY OF THE INVENTION

Therefore, a purpose of the present invention is to provide a data load sequencer that provides for the efficient loading of parallel data channel data serializers in order to reduce the delay to first new data available period.

This is accomplished in the present invention by providing a data load sequencer in conjunction with a multi-stage, multiple parallel data channel serializer. Each data channel of the data serializer preferably includes a data sensing stage and a data latching stage. The data load sequencer is responsive to the provision of an address for selecting data from the main buffer memory for provision to the serial buffer memory. The load sequencer preferably includes control logic for receiving the main buffer memory address and directing the transfer of data between the main and serial buffer memories, an address counter for receiving a start location address referencing a beginning serial data buffer memory location for the storage of data sourced to or from the data serializer. The control logic preferably provides for the selection of respective data from the serial data buffer for each of the parallel data channels and for enabling, sequentially, the parallel sensing and latching of the respectively selected data for sourcing from the data serializer.

Thus, an advantage of the present invention is that it implements a manner of rapidly loading both a serial data buffer memory and each of the parallel channels of its associated data serializer.

Another advantage of the present invention is that it provides for non-alternating parallel operation of the data channels during new data load to minimize the delay to new data ready period.

A further advantage of the present invention is that the data load sequencer makes optimal use of the existing functional components of the data serializer to accomplish high speed data loading in a minimum period.

Still another advantage of the present invention is that none of the features and functions of a multiple data channel data serializer are compromised by the presence and operation of the data load sequencer of the present invention.

A still further advantage of the present invention is that it provides the first of the new data available at the conclusion of the data load cycle without receipt of a data source timing clock signal.

BRIEF DESCRIPTION OF THE DRAWINGS

These and other attendent advantages of the present invention will become better understood and appreciated by reference to the following detailed description of the invention when considered in conjunction with the accompanying drawings, wherein like reference numerals indicate like parts throughout the figures thereof, and wherein.

DETAILED DESCRIPTION OF THE INVENTION

Figure 1:
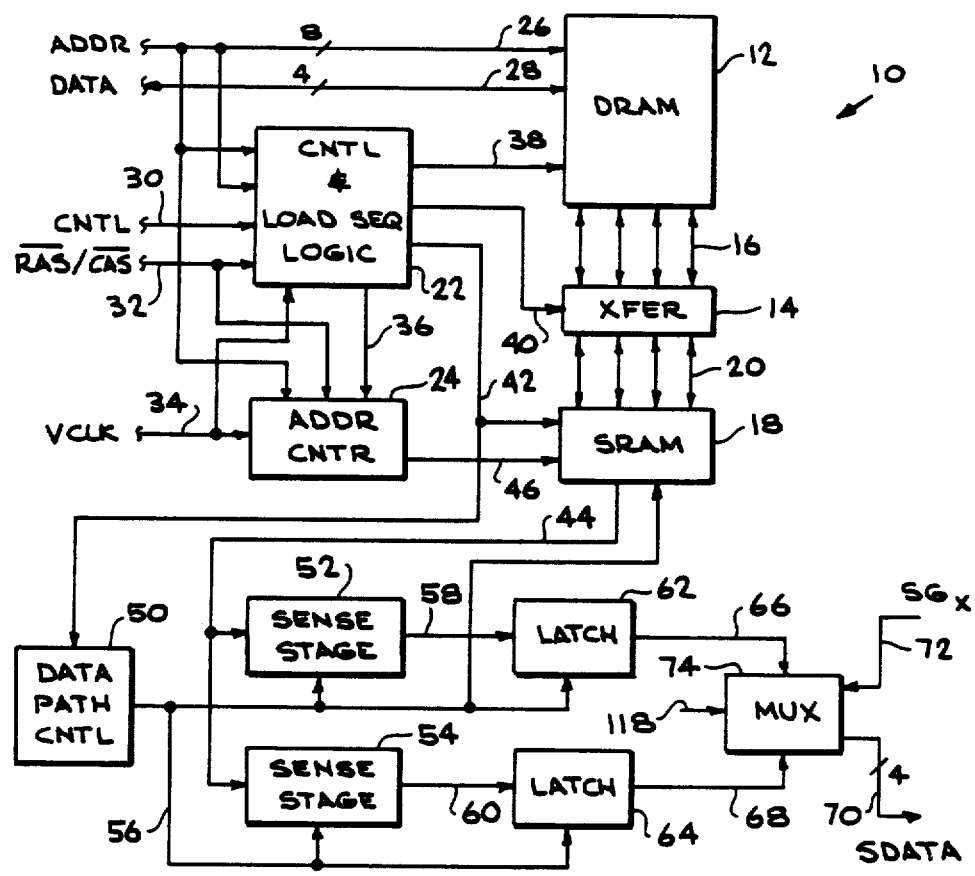
FIG. 1 is a simplified block diagram of a data serializer embodying a load sequencer in accordance with a preferred embodiment of the present invention.

A dual parallel channel data serializer, generally indicated by the reference numeral 10, is shown in FIG. 1 as an exemplary serializer embodying the load sequencer of the present invention. As shown, a dynamic random access memory (DRAM) buffer 12 is utilized as the main buffer memory of the serializer 10. A static random access memory (SRAM) buffer 18 is utilized as the serial data buffer memory. Internal data transfers, or parallel data loads, are permitted between the DRAM and SRAM buffer memories 12, 18 by the transfer gate block 14 as coupled thereinbetween by the parallel data lines 16, 20. A control and load sequencer logic unit 22 is provided to coordinate external data transfers between a host processor (not shown) and DRAM buffer memory 12 and between the DRAM and SRAM buffer memories 12, 18. Addresses provided by the host processor are received by the data serializer 10 on the address lines 26. Various control signals, including a write control signal, are provided on lines 30 while memory timing signals, such as row address strobe (RAS) and column address strobe (CAS) are provided on lines 32. For data transfers between the host processor and the DRAM buffer memory 12, the control and load sequencer logic 22 provides the appropriate control and timing signals to the DRAM buffer memory 12 via the DRAM control and timing lines 38. Depending on the control signals initially provided by the host processor on lines 30, data is transferred to or from the DRAM buffer memory 12 via the data lines 28. The source or destination of the data transferred with respect to the DRAM buffer memory 12 is specified by the host processor by its selection of the address provided on the address lines 26.

Preferably, data loads between the DRAM and SRAM buffer memories 12, 18 are initiated in response to an address and specific combination of control and timing signals provided by the host processor on lines 26, 30, 32 to the data serializer 10. In particular, where the data capacity of the SRAM buffer memory matches that of a single row of the DRAM buffer memory as is preferred, the row selection portion of the address provided by the host processor is preferably utilized to designate a row within the DRAM buffer memory 12 as the source or destination for the data load. Further, the write control and the timing signals provided on lines 30, 32 preferably select the direction of the data load between the DRAM and SRAM buffer memories 12, 18. Accordingly, the control and load sequencer logic unit 22 provides control and timing signals to the DRAM buffer memory 12 via lines 38, to the SRAM buffer memory 18 via lines 42 and a load enable control signal to the load gate block 14 via the control line 40.

Preferably also present within the data serializer 10 is an address latch and counter 24. Preferably the column select portion of the address provided on the address lines 26 is received by the address latch and counter 24 along with the column address strobe signal from the timing lines 32. Further, the address latch and counter 24 preferably receives a clock signal, $V_{CLK}$, on line 34 as a timing signal sychronized to the rate that serial data is sourced to or from the data serializer 10. Finally, an address load enable signal is provided by the control and load sequencer logic unit 22 via the control line 36. The address latch enable signal is preferably provided whenever the control and load sequencer logic unit 22 determines that the host processor is providing a new, initial count value for use by the address latch and counter 24, such as in conjunction with the loading of a new row of data from the DRAM 12 to SRAM buffer memory 18.

Preferably, the count value provided by the address latch and counter 24 on the counter output lines 46 is utilized to select corresponding memory locations from the SRAM buffer memory 18 and the data lines 44 of the SRAM buffer memory 18 for coupling via the dual parallel, serial data channel sense stages 52, 54 of the serializer 10. A serial data path controller 50, operating under the controlling direction of the control and load sequencer logic unit 22 as manifested via the control lines 42, sequentially enables the respective decode selection of an SRAM data location, the sensing of data therefrom and provision, via sense stage output lines 58, 60, to a respective data latch 62, 64 and the latching of the data therein. The serial data path controller 50 preferably operates each of the parallel data channels of the preferred dual parallel channel serializer 10 so as to alternately provide data into the latches 62, 64. Thus, with each $V_{CLK}$ signal received by the control and load sequencer logic unit 22, a data channel select control signal is provided on the multiplexor select line 118 of a multiplexor 74 so as to alternately provide data obtained from the latches 62, 64, via data lines 66, 68, onto the serial data output lines 70 of the serializer 10. Preferably, an external serial data output enable signal ($\overline{SG_x}$), provided on a control line 72 to the multiplexor 74, may be used by the host processor to selectively enable the multiplexed output of data onto the serial output lines 70.

Figure 2:
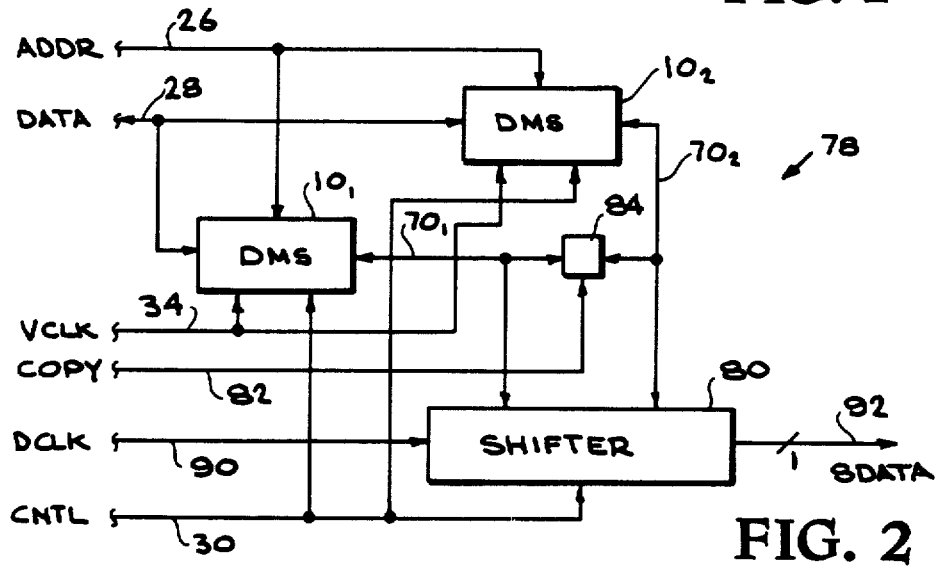
FIG. 2 is a simplified system block diagram illustrating the cooperative operation between a plurality of data serializers in a manner uniquely afforded by the present invention.

The diagram of FIG. 2 illustrates a system incorporating two serializers $10_1$, $10_2$ coupled to a high speed serial shift register 80 for providing a bit serial stream of data as may be appropriate for high resolution video graphics applications. The serializers $10_1$, $10_2$ receive, in parallel, the address and data buses 26, 28, a video clock signal, on the $V_{CLK}$ line 34, and various control and timing signals, here shown simply as provided on lines 30. The shifter 80 receives a high frequency dot clock ($D_{CLK}$) signal via a line 90 in addition to at least some of the control signals provided on lines 30. The serial bi-directional data buses $70_1$, $70_2$ of the serializers $10_1$, $10_2$ are provided in parallel to the shifter 80. Preferably, the serial data buses $70_1$, $70_2$ each provide four bits in parallel. That is, the serializers $10_1$, $10_2$ provide a serialized reduction in the bit parallel width of the row data initially loaded in parallel to their respective SRAM buffer memories 18. Thus, the shifter 80, as shown in FIG. 2, provides for a further serializing reduction of data width from the 8-bits parallel provided by the two paralleled serializers $10_1$, $10_2$ to a single bit wide serial data stream ultimately provided on the shifter output line 92.

In accordance with a preferred embodiment of the present invention, new data is present and available on the serial data bus $70_1$ from the serializer $10_1$ at the conclusion of an internal data load cycle and prior to the first significant edge transistion of the $V_{CLK}$ signal following the data load cycle. This presumes that the serializer $10_1$ is placed in a "next cycle read" mode during the data load cycle. That is, in the first cycle following the conclusion of the data load cycle, newly available data will be read from the data serializer onto the serializer output bus $70_1$. By provision of a bi-directional transfer gate 84, selected in response to a copy (COPY) enable signal provided on a control line 82, the data from the serial bus $70_1$ may be also made available on the serial data bus $70_2$ of the second serializer $10_2$. Again provided that the host processor has placed the second serializer 102 in a "next cycle write" data mode, wherein data is sourced or written from the serial data bus $70_2$ into the serial data SRAM buffer memory of the serializer $10_2$, a one for one transfer of data from the SRAM buffer memory of the serializer 101 to that of the serializer $10_2$ will occur with the subsequent, sequential provision of the $V_{CLK}$ signal. Accordingly, an image of the data contained in the DRAM memory array of the first serializer $10_1$, or any portion thereof, may be transferred to the DRAM buffer memory of the second serializer $10_2$ without requiring any significant host processor interaction. This system oriented advantage is uniquely due to the ability of the the present invention to provide the first new data available on the serial bus $70_1$ at about the conclusion of a data load cycle and prior to the first following significant $V_{CLK}$ edge transistion.

Figure 3:
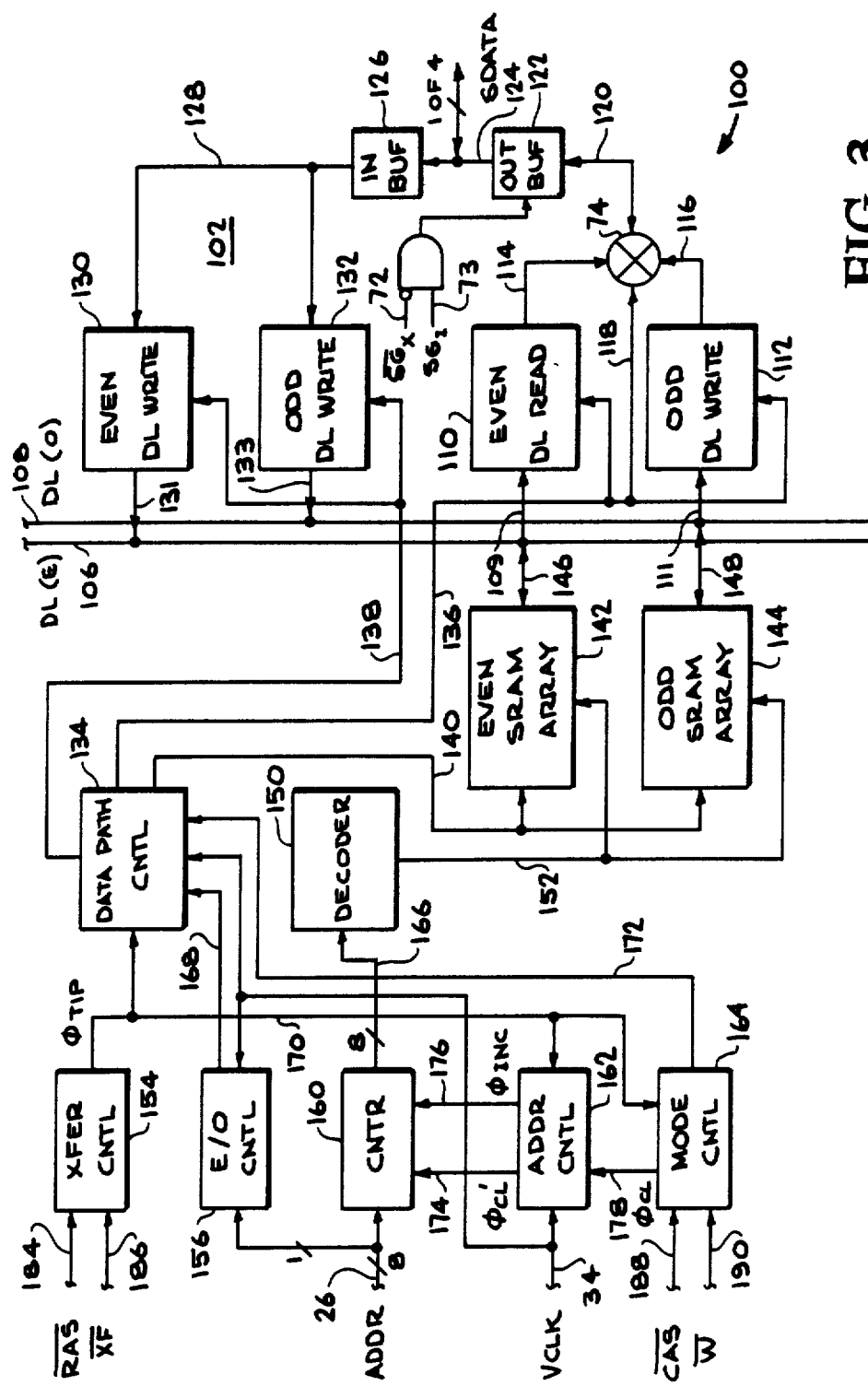
FIG. 3 is a detailed block diagram of a dual data line, dual parallel data channel data serializer and load sequencer constructed in accordance with a preferred embodiment of the present invention.

Referring now to FIG. 3, the significant components of a preferred embodiment of a control and load sequencer unit are shown in conjunction with the corresponding significant portions of a complete dual data channel data serializer. Included within the control logic unit is a transfer control block 154 that receives the row address strobe ($\overline{RAS}$) and transfer ($\overline{XF}$) signals on the lines 184, 186, respectively. The transfer control block 154 preferably determines whether a data load cycle is being requested by examining the states of the row address strobe and transfer signals. A resulting data load transfer in progress signal ($\phi_{TIP}$) is provided during the requested data load cycle on the transfer control block output line 170 to the data path controller 134, an address control block 162 and a mode control block 164.

The mode control block 164 operates in response to the transfer control block 154 to determine whether the first serial data transfer cycle following a currently in progress data load cycle will be a serial data read or write cycle. That is, the transfer control block 154 provides the mode control block 164 with the data load transfer cycle in progress signal via line 170. At about the same time, the column address strobe and write select control signals are also received by the mode control block 164 via lines 188, 190, respectively. The state of the write select signal at the significant edge transistion of the column address strobe signal is preferably utilized to identify the next cycle serial data transfer direction. The result of this determination by the mode control block 164 is provided on control line 172 to the data path controller 134. Additionally, the occurance of the significant edge transistion of the column address strobe signal is reported to the address control block 162 via control line 178. In response, the address control block 162 preferably provides a counter load signal to the counter 160. Consequently, the address as provided by the host processor on the address bus 26 is latched into the counter 160 as its new count value. This count value is, in turn, provided over the counter output bus 166 to an address decoder 150. In subsequent operation, the counter 160 will generate new count values, generally in response to the $V_{CLK}$ signal as provided on line 34 to the address control block 162 and then as a counter increment control signal ($\phi_{INC}$) to the counter 160 via increment control line 176.

Finally, an even/odd control block 156 is preferably provided to select, at a minimum, one of the parallel data channels for providing the first new data at the conclusion of the current data load cycle. The even/odd control block 156 therefore preferably receives, at least, the single least significant bit of the address provided by the host processor via the address bus 26. An even or odd select signal, in the case of dual data channels, is thereby generated by the even/odd control block 156 and provided to the data path controller 134 via control line 168.

In accordance with the preferred embodiment of the present invention, the remainder of the data serializer includes the serial data buffer memory partitioned as respective even and odd SRAM arrays 142, 144, dual data lines 106, 108 respectively coupled to the even and odd SRAM arrays 142, 144 by respective even and odd SRA bit lines 146, 148, even and odd data line read circuits 110, 112, respectively coupled to the even and odd data lines 106, 108 at the even read data mode 109 and the odd read data mode 111, and, further, to the multiplexor 74 by the even read data output data line 114 and odd read data output data line 116. The multiplexor output line 120 is further connected to the output buffer 122, gated in response to the internal ($SG_I$) and user supplied external ($\overline{SG}_X$) serial output enable signals on the output enable control lines 72, 73 to finally provide serial data read from the even or odd SRAM arrays 142, 144 on the serializer data output lines 124.

To support bi-directional serial data transfer capabilities, an input buffer 126 is coupled to the output data lines 124. The output of the input buffer 126 is provided via lines 128 to even and odd data line write circuits 130, 132. Preferably the even and odd data line write circuits 130, 132 provide for the alternatively latched buffering and driving of data onto the respective even and odd data lines 106, 108 via the even and odd data line write data nodes 131, 133. Timing control of the even and odd data line write circuits 130, 132 is preferably again provided by the data path controller 134 as applied via control and timing lines 138.

Figure 4:
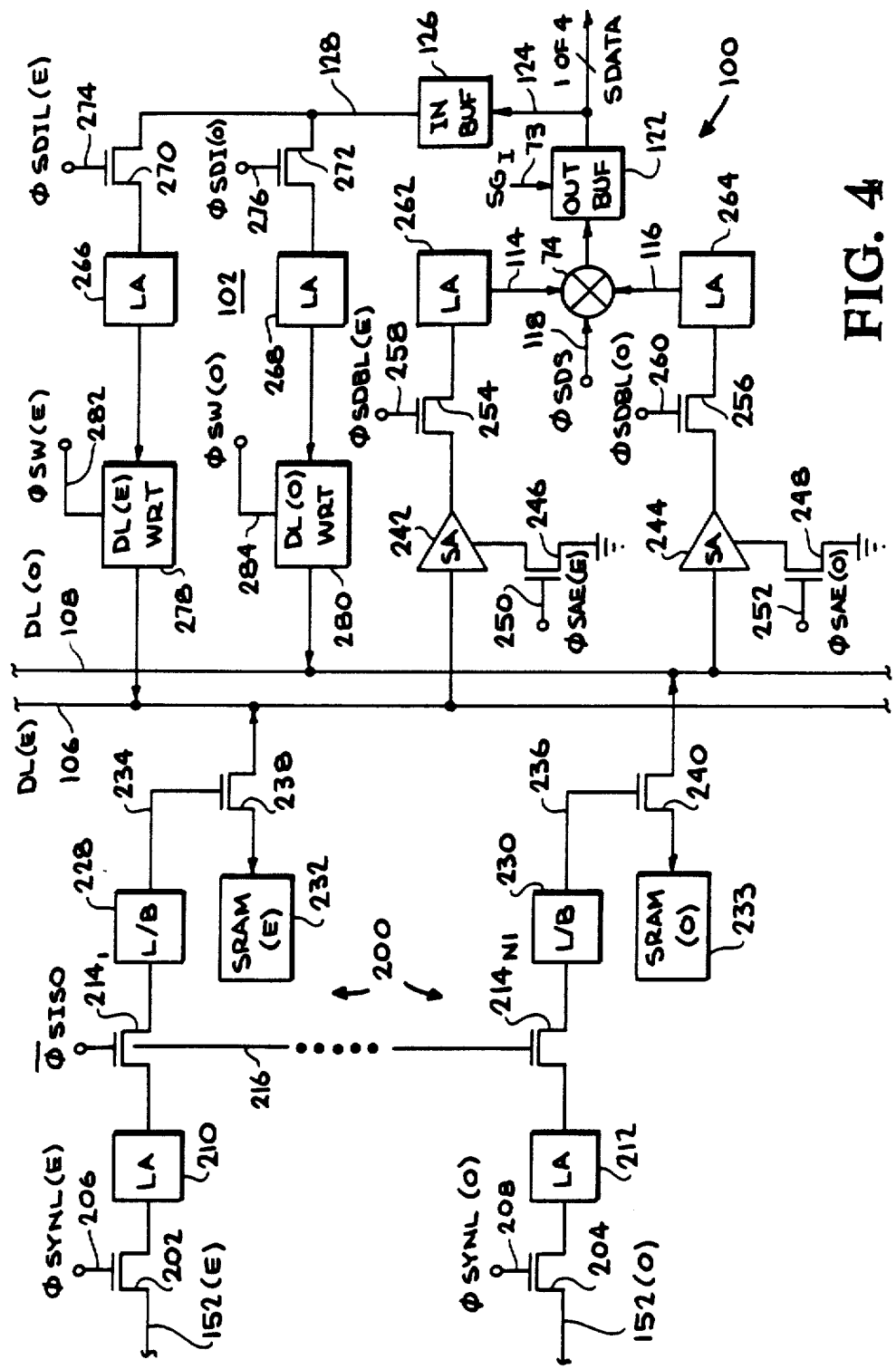
FIG. 4 is a detailed schematic diagram of a preferred dual data line, dual data channel data serializer for use in conjunction with a preferred embodiment of the present invention.

The preferred circuit architecture for the decoder 150, even and odd SRAM arrays 142, 144 and the dual data channel read and write circuits 100, 102, as well as the preferred mode of operation, is shown and described in the aforementioned "High Speed Data Serializers". Accordingly, the disclosure of that application is expressly incorporated herein by reference. For convenience, however, FIG. 4 provides a circuit diagram of the significant perferred circuitry associated with respective even and odd SRAM memory cell logic circuits and the preferred circuitry of the data line read and write circuits 110, 112. Generally, as shown in FIG. 4, the exemplary even and odd SRAM logic circuits 200 are coupled to discretely decoded logic output lines 152 of the decoder 150 corresponding to the intended selection of their even and odd SRAM cells 232, 233. In ordinary operation, separate states of the decoder output lines 152 are enabled for ultimate storage in the even and odd latched buffers 228, 230 by the alternate, mutually execlusive provision of the $\phi_{SYNL(E)}$ and $\phi_{SYNL(O)}$ signals to the respective gate control lines 206, 208 of even and odd selection enable gates 202, 204. Thus, the contents of the even and odd SRAM cells 232, 233 are passed onto the respective data lines 106, 108 by the even and odd data pass gates 238, 240. As described in the aforementioned application, the preferred mode of operation provides for the selection of separate even and odd SRAM logic circuits 200 during alternate clock cycles. That is, a new count value is provided to the decoder 150 in response to each significant edge transistion of a clock signal and, shortly following therefrom, either the even or odd SRAM array selection enable gates 202, 204 are D enabled by provision of the $\phi_{SYNL(E)}$ or $\phi_{SYNL(O)}$ signals. Thus, the single even or odd logic circuit 200, corresponding to the single decoded "on" or selected output line of the decoder 150, receives an SRAM select signal to be latched into a logic circuit 200 upon withdrawal of the $\phi_{SYNL(E)}$ or $\phi_{SYNL(O)}$ signal.

Consistent with the resultant alternating selection and provision of data onto the even and odd data lines 106, 108, the even and odd sense amplifiers 242, 244 and sensed data transfer gates 254, 256 are enabled by the respective provision of the $\phi_{SAE(E)}$, $\phi_{SAE(O)}$, $\phi_{SDBL(E)}$ and $\phi_{SDBL(O)}$ signals to their respective control gate enable lines 250, 252, 258, 260. Thus, in alternating clock cycles, new data is provided to the even and odd latches 262, 264 and thereby made available to the multiplexor 74 via multiplexor input lines 114, 116. Selection of an even or odd data latch 262, 264 appropriately alternates with each clock cycle in response to the provision of the $\phi_{SDS}$ signal on the multiplexor select control line 118. The output of the multiplexor 74 is provided via the output buffer 122 onto the serial data output lines 124.

Ordinary write operations preferably utilize the input even and odd data gates 270, 272 to effectively demultiplex serial data from the output data line 124 as provided via the input buffer 126 out to the input buffer output line 128. Preferably, the $\phi_{SDIL(E)}$ and $\phi_{SDIL(O)}$ signals are provided from the data path controller 134 on the respective control gates 274, 276 during alternate clock cycles. Thus, during each clock cycle, data is passed via the even or odd latches 266, 268 to the even and odd data line write circuits 278, 280. These write circuits 278, 280 are respectively enabled by $\phi_{SW(E)}$ and $\phi_{SW(O)}$ signals provided on the write control lines 282, 284, resulting in the driving of data onto their respective even or odd data lines 106, 108. In anticipation of the data being written, a respective even or odd SRAM logic circuit 200 is selected by the earlier provision of an appropriate count value to the decoder 150. Thus, data is passed from the even or odd data line 106, 108 to the selected even or odd SRAM cell 232, 233 via the SRAM data pass gate 238 or 240.

In accordance with the present invention, even and odd decoded address select latches 210, 212 are provided in each of the SRAM logic circuits 200 of the respective even and odd SRAM arrays 142, 144. The latches 210, 212 are respectively positioned to receive and latch the logic circuit select signal provided on their respective decoder input lines 152 as received via the select signal pass gates 202, 204. Further in accordance with the present invention, selection signal blocking gates $214_{1-n}$ are provided in each of the SRAM logic circuits so as to couple their respective latches 210, 212 with the latched buffers 228, 230. All of the select blocking gates $214_{1-n}$ are preferably controlled in common by a $\overline{\phi_{SISO}}$ signal provided on the gate control line 216. Thus, by provision D of the $\overline{\phi_{SISO}}$ signal, the selection of even or odd SRAM cells 232, 233 can be effectively halted independent of the operation of the counter 160, decoder 150 and, with the exception of the $\overline{\phi_{SISO}}$ signal, the data path controller 134. Finally, in accordance with the present invention, the output buffer 122 is modified to permit the selective enabling of its provision of serial data onto the serial data output line 124 in response to an internally generated serial output enable signal ($SG_I$) provided on a control line 73 from the data path controller 134. In particular, as shown in FIG. 3, the internal ($SG_I$) and the complementary external ($\overline{SG_X}$) serial output enable signals are combined by a logical AND function to determine the output enable state of the output buffer 122.

Figure 5:
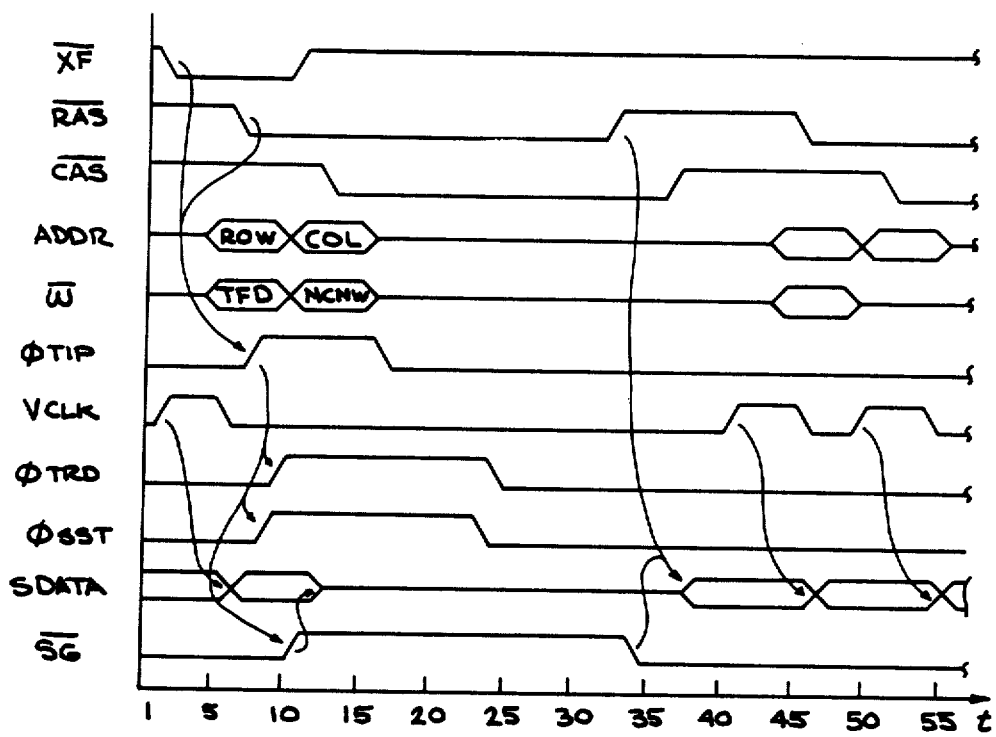
FIG. 5 is a timing diagram illustrating the preferred mode of operation of a logic sequencer constructed in accordance with the present invention.

Reference is now made to FIG. 5 wherein the timing of a data load cycle performed in accordance with the present invention and, further, with respect to the preferred data serializer architecture, as shown in FIG. 3, is illustrated. Preferably, a data load cycle is selected by a significant edge transistion of the transfer signal $\overline{XF}$ that of the row address strobe signal, occuring at about $t_1$ and $t_7$, respectively. In accordance with conventional DRAM address timing, a row address value is provided at about $t_4$ and prior to the significant edge transistion of the row address strobe signal. Preferably, also at about $t_4$, the state of the write control signal is utilized to indicate the desired data load direction during the current data load cycle. This data load direction indicator is preferably latched into the mode control block 164 in response to the data load transfer in progress signal from the transfer control block 154. Preferably, the significant edge transistion of the transfer in progress signal, when received by the data path controller 134, instigates the provision of a $\phi_{SST}$ signal, if the data load transfer direction is to the SRAM arrays 142, 144, at about $t_8$ and the provision of a $\phi_{TRD}$ signal at about $t_{10}$. The $\phi_{SST}$ and $\phi_{TRD}$ signals are both shown and described in U.S. Pat. No. 4,731,758, entitled "Dual Array Memory With Inter-array Bi-directional Data Transfer", filed June 21, 1985 and assigned to the assignee of the present invention. Accordingly, the disclosure of the above patent application is expressly incorporated herein by reference. For purposes of completeness with respect to the present invention, it is sufficient to say that the $\phi_{SST}$ signal is provided beginning just prior to a data load cycle from the DRAM buffer memory 12 to the SRAM buffer memory 18 and subsequently withdrawn to latch the data load transferred data into the SRAM buffer memory 18. Preferably, with respect to data load cycle transfers from the SRAM buffer memory 18 to the DRAM buffer memory 12, the $\phi_{SST}$ signal is not actually generated, but rather an emmulation signal $\phi_{SST'}$ is generated to effectively define both the beginning and end of the actual transfer of data between the DRAM and SRAM buffer memories 12, 18. The generally related signal $\phi_{TRD}$ is provided immediately after the o provision of the $\phi_{SST/SST'}$ signal and is utilized to enable the transfer gates within the transfer logic block 14. The $\phi_{TRD}$ signal is preferably withdrawn shortly after the withdrawl of the $\phi_{SST/SST}$ signal at about $t_{25}$ and, thus, after the transferred data has been latched into its destination.

Also in response to the significant edge transistion of the $\phi_{TIP}$ signal, the internal serial output enable signal ($SG_I$) is withdrawn at about $t_{10}$. This results in a termination of the validity of the serial data present on the data output line 124 at about $t_{12}$; the data having been present since about $t_7$ in response to the last significant edge transistion of the $V_{CLK}$ signal occuring at about $t_1$ and prior to the initiation of the current data load cycle. Preferably, the serial data output lines 124 of the output buffer 122 are simply placed in a high impedance state in response to the withdrawal of the internal serial output enable signal.

The write control signal is further used, in accordance with the present invention, to indicate the serial data transfer direction desired in at least the first serial data transfer cycle following the conclusion of the present data load cycle. That is, following the significant edge transisiton of the row address strobe signal, the write control signal changes to a state appropriate to indicate that the next cycle following completion of the current data load cycle will be either a serial data transfer read or write. Preferably, the next cycle serial data transfer direction establishes the transfer direction of the serial data stream until the next data load cycle. In the preferred embodiment, the write control signal changes state beginning at about $t_{10}$ along with the conventional change of state on the address bus to provide the column portion of the address. The state of the write control signal is preferably latched into the mode control block 164 at about $t_{13}$ in response to the significant edge transistion of the column address strobe signal. Accordingly, the mode control logic block 164 provides the data path controller 134 with a logic signal, via lines 172, indicative of the selected next cycle serial data transfer direction. This permits the data path controller 132 to perform the appropriate management of the data paths during the data load cycle in preparation for the indicated next cycle serial data transfer.

Finally, at about $t_{32}$, the row address strobe signal is withdrawn. Preferably, where a next cycle serial data read is selected for the next serial data transfer cycle, this trailing edge transistion of the row address strobe signal follows the completion of the loading of each of the serializer data channels. Thus, upon withdrawal of the row address strobe signal, serial data is available on the serial data bus 124 as early as about $t_{38}$. The appearance of this first serial data may be delayed by extending the $\overline{RAS}$ active period or lost by failure to provide the external serial output enable signal ($\overline{SG}_X$) in time. Thus, the provision of the external serial output enable signal is a further prerequisite for the provision of valid data on the serial data output bus 124. Accordingly, the external serial output enable signal is preferably provided at about $t_{34}$.

Assuming again that the next serial data transfer cycle following the conclusion of a data load cycle is a serial data read cycle, beginning at about $t_{40}$, the first of the new serial data is present and available on the serial data output bus 124 between about $t_{37}$ to about $t_{46}$. The significant edge transistion of the $V_{CLK}$ signal causes the next new serial transfer data to be provided onto the serial data output bus 124 at about $t_{46}$, whereupon the data remains valid until about $t_{55}$. Alternately, assuming that the first serial data transfer cycle following the data load cycle is a serial data write cycle, data provided by another serial data source, including another serial data serializer 10, is preferably present on the serial data output bus 124 prior to the significant edge transistion of the first $V_{CLK}$ signal at about $t_{40}$. Significantly with regard to both next cycle read and write serial data transfer operations, the present invention provides for the immediate provision or utilization of serial data present on the serial data bus 124 prior to the first significant edge transistion of the $V_{CLK}$ signal following a data load cycle.

Figure 6:
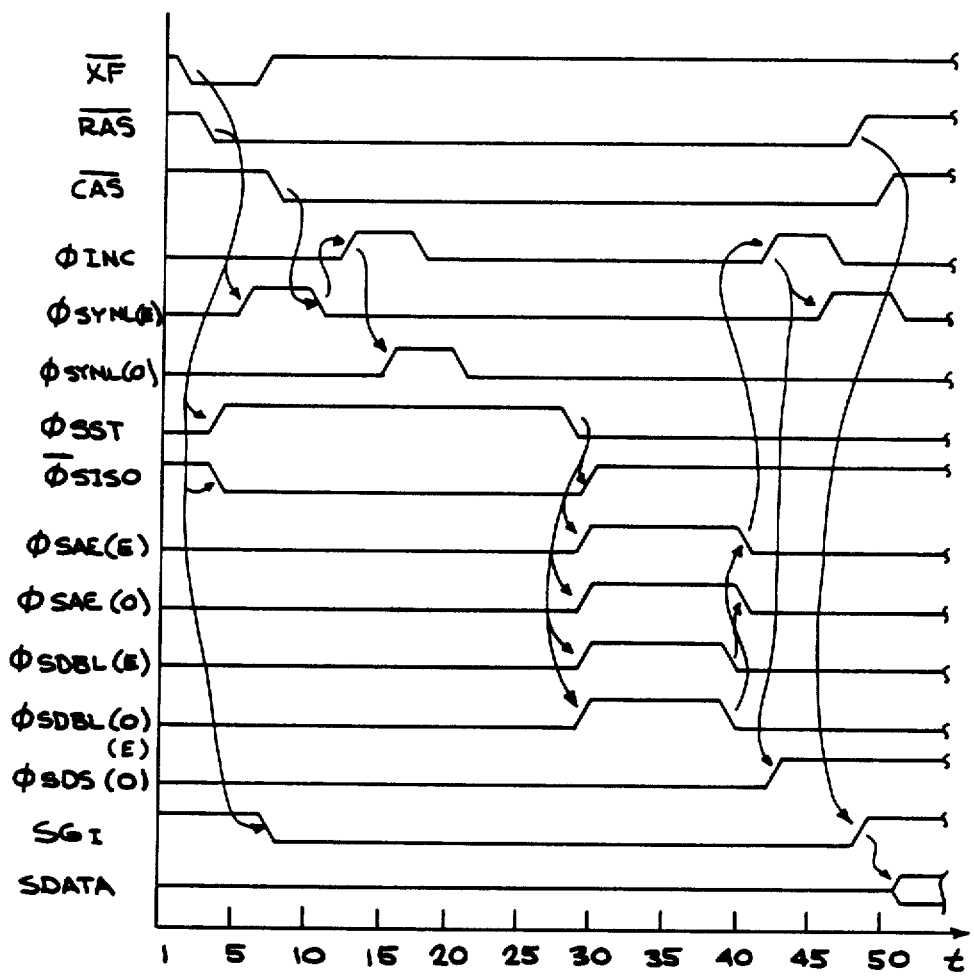
FIG. 6 is a detailed timing diagram illustrating the data transfer cycle (next cycle write) control of a preferred dual data line, dual data channel data serializer in accordance with a preferred embodiment of the present invention.

Considering the operation of the preferred embodiment of the present invention in greater detail, reference is now made to FIG. 6. In order to provide for the full data loading of the parallel data channels of the data serializer 10 during a data load cycle in preparation for a next cycle read of serial data in accordance with the present invention, the address selection of SRAM data locations is performed concurrent with the DRAM to SRAM buffer memory data load. The sensing of each of these preselected SRAM data locations begins immediately on conclusion of the data load and, further, in parallel for each of the data channels. In greater detail, the transfer signal ($\overline{XF}$) is preferably provided as shown at about $t_1$ followed by the row address strobe signal at about $t_3$ to indicate the beginning of a data load cycle. Preferably the write control signal (not shown) is at a logic "one" level at $t_3$ to indicate a DRAM to SRAM buffer memory data load direction. In response to the transfer in progress signal of the transfer control block 154, the data path controller preferably issues the $\phi_{SST}$ and $\overline{\phi_{SISO}}$ signals at about $t_4$. The SRAM buffer memory 18 is therefore set to receive the row data to be transferred while the decoder 150 is effectively prohibited from interferring with the row data transfer by the selection of any individual SRAM data cells 232, 233. Additionally, the internal serial output enable signal is withdrawn at about $t_7$ preferably to prevent the inadvertent provision of data onto the serial data bus 124.

While the row data selected in response to the row address, is in transit between the DRAM and SRAM buffer memories 12, 18 from about $t_5$ to $t_{28}$, the selection of a SRAM cell 232, 233 for each of the data channels proceeds. That is, the column address provided following the row address to the DRAM buffer memory 12 is latched into the counter 160 in response to the column address strobe and counter load signals provided via lines 188 and 178, 174. The column address, as a count value, is provided to the decoder 150 for decoding. The $\phi_{SYNL(E)}$ signal, assuming an even count value as recognized by the E/O control block 156, is first preferably provided about t and maintained until the output of the decoder 150 has settled. Thus, at about $t_{10}$, the $\phi_{SYNL(E)}$ signal is withdrawn to conclude the latching of a SRAM cell select signal in one of the even latches 210. The $\phi_{INC}$ signal is then self-generated by the address control block 162 and provided to the counter 160 at about $t_{12}$. Consequently, the count value stored by the counter 160 is incremented and again provided to the decoder 150 for decoding. At about $t_{15}$ the $\phi_{SYNL(O)}$ provided by the data path controller 134 and maintained again until the decoded outputs of the decoder 150 have settled. Thus, at about $t_{20}$, the $\phi_{SYNL(O)}$ signal is withdrawn with the resultant latching of a SRAM cell select signal in a corresponding one of the odd latches 212. Consequently, the initial steps in selecting respective even and odd SRAM cells 232, 233 is substantially complete pending only the conclusion of the DRAM to SRAM row data load.

At about t$_{29}$ the data path controller 134 withdraws the φ$_{SST}$ signal to latch the row data into the SRAM buffer memory 18. This event signals that the loading of the serial data channels can continue. Thus, the withdrawal of the φ$_{SISO}$ signal at about t$_{30}$ allows the completion of the selection of the even and odd SRAM cells 232, 233. That is, the even and odd select signals transfer to the latched buffers 228, 230 and enable their respective data pass gates 238, 240. The data present in the even and odd SRAM cells 232, 233 are provided simultaneously onto the respective even and odd data lines 106, 108. The data path controller 134 then provides sense amplifier enable signals φ$_{SAE(E)}$ φ$_{SAE (O)}$ to enable the parallel operation of the even and odd serial data channel sense amplifiers 242, 244. Also provided are the even and odd sense data latch enable signals φ$_{SDBL(E)}$' φ$_{SDBL(O)}$ to the control lines 258, 260 of the sense amplifier data pass gates 254, 256. After a delay appropriate for the sense amplifiers 242, 244 to sense the data from the respective even and odd data lines 106, 108, and to allow for the corresponding data to be present and stable in the latches 262, 264, the data path controller 134 withdraws the φ$_{SDBL(O)}$ and φ$_{SDBL(O)}$ signals. In turn, the φ$_{SAE(E)}$ and φ$_{SAE(O)}$ signals are withdrawn to conclude the serializer data load cycle at about t$_{40}$.

In preparation for subsequent serial data transfer cycles, the φ$_{INC}$ signal is generated and provided by the address control block 162 to the counter 160 at about t$_{40}$This begins the next serial data loading of the serial data channel whose data is first selected for output following the data load cycle. As illustrated, the first serial data sourced will originate from the even SRAM array 142. Thus, at about t$_{41}$, the data path controller 134 provides the φ$_{SYNL(E)}$ signal to begin loading the even serial data transfer channel. Finally, the significant edge transistion of the φ$_{INC}$ signal also prompts a change in state of the φ$_{SDS}$ signal to select an appropriate serial data channel data latch 262, 264 for the provision of serial data onto the output data bus 124. As should be readily appreciated, the even data latch 262 is selected. In subsequent consecutive serial data read transfer cycles, the preferred embodiment of the present invention begins the SRAM cell selection process while the same serial channel's data buffer is selected and the alternate serial data channel senses and latches SRAM data.

Finally the row address strobe signal is withdrawn, here shown at about t$_{47}$. In response, the data path controller 134 preferably provides the internal serial data enable signal, assuming the prior withdrawal of the external serial data enable signal, with the selected multiplexed serial data being provided on the serial data output line 124 at about t$_{51}$.

Figure 7:
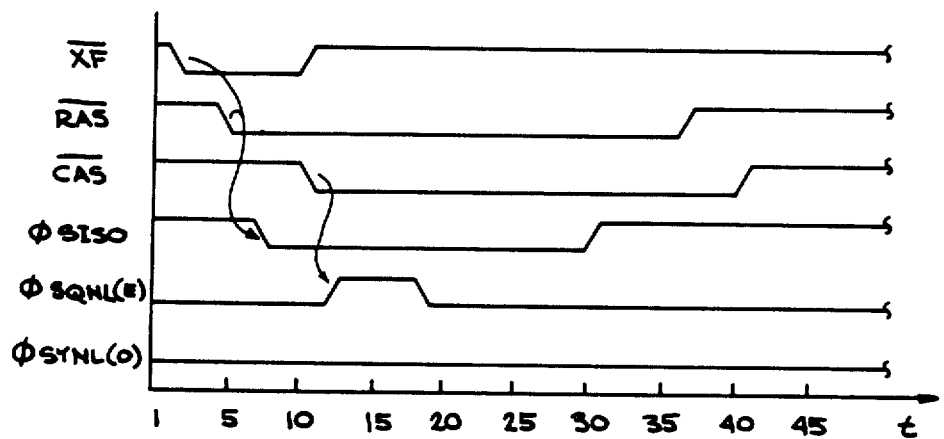
FIG. 7 timing diagram illustrating the data transfer cycle (next cycle read) control of a preferred dual data line, dual data channel data serializer in accordance with a preferred embodiment of the present invention.

Considering now the timing diagram provided illustrated in FIG. 7, a data transfer cycle involving a next cycle write operation is substantially simpler than that involving a next cycle read. As before, the significant edge transistions of the transfer and row address strobe signals at t$_1$ and t$_4$, respectively, are used to establish that the present cycle is a data load cycle. Accordingly, the data path controller 134 preferably provides, at about t$_6$, and thereafter maintains the $\overline{\phi}_{SISO}$, signal until the data from the SRAM buffer memory 18 is fully latched into the DRAM buffer memory 12 at about t$_{30}$. Meanwhile, at about t$_{10}$, the column address provided in the addressing of the DRAM buffer memory 12 is loaded into the counter 160 in response to the significant edge transistion of the column address strobe signal.

Since serial data is to be written into the SRAM buffer memory 18, the data path controller 134 need provide only for the selection of a signal SRAM memory cell 232, 233 to receive the serial data written in the first serial data transfer cycle. Assuming that the column address latched into the counter 160 corresponds to an even SRAM memory cell 232, the data path controller 134 provides for the storage of the corresponding SRAM cell select signal in the even latch 210 by the provision of the φ$_{SYNL(E)}$ signal between about t$_{12}$ and t$_{19}$. With the completion of the SRAM to DRAM data load as defined by the withdrawal of the $\overline{\phi}_{SISO}$, signal, the select signal is freed to be latched into the latched buffer 228. This enables the data path transistor 238 of the selected even SRAM memory cell 232 in preparation for receipt of serial data.

Thus, there has been described a high performance data load sequencer for multiple data line serializers that provides for the rapid loading of all of the multiple parallel data channels substantially in parallel in order to minimize the time required for the production of new valid data at the output of the data serializer following the initiation of a serializer data load cycle.

Naturally, many modifications and variations of the present invention are possible in light of the above teachings. In particular, persons of ordinary skill in the art will appreciate that the various timing diagrams disclosed and discussed herein illustrate relatively timed events and may be scaled or otherwise altered within the parameters and relations taught above. It is therefore to be understood that, within the scope of the appended claims, the invention may be practiced otherwise than as specifically described herein.

We claim:

1. Apparatus providing for the transfer of a serial data stream through a serial data port, said apparatus comprising:
   (a) first memory array providing for the static storage of data at row and column address designated array locations;
   (b) second memory array providing for the storage of data at column address designated array locations;
   (c) means for transferring data from a row of column address array locations of said first memory array to respective column address array locations of said second memory array;
   (d) a plurality of data channels coupled in parallel between said second memory array and said serial data port for transferring respective data from said second memory array for provision as said serial data stream, each of said data channels including a data sensing stage for sensing data obtained from said second memory array and a data latching stage coupled between said data sensing stage and said serial data port;
   (e) counter means, responsive to an initial predetermined column address value, for successively generating column addresses relative to said initial column address;
   (f) decode means for transferring data between a column address array location of said second memory array specified by said counter means, and a data sensing stage of said plurality of data channels; and
   (g) means for controlling said transfer means, said plurality of data channels, said counter means and said decode means, said controlling means enabling said counter means to generate a first column address concurrent with the transfer of data by said transferring means, enabling said decode means upon transfer of data into said second memory array and enabling the one of said data channels receiving data transferred by said decode means to sense and to provide latched data to said serial port.

2. The apparatus of claim 1 wherein said apparatus is responsive to a first memory array data access address including row and column address portions and wherein said controlling means is responsive to the column address portion of said data access address for selecting said initial predetermined column address value provided to said counter means.

3. The apparatus of claim 2 wherein said transferring means includes an array of transfer gates coupled between respective columns of said first memory array and respective column address array locations of said second memory array and wherein said plurality of data channels are coupled to respective sub-portions of said second memory array.

4. The apparatus of claim 3 wherein said plurality of data channels are related as respective pairs of data channels and wherein said counter means successively generating column addresses relative to the respective sub-portions of said second memory array and said initial predetermined column address alternately for the respective members of the pairs of said data channels.

5. The apparatus of claim 4 wherein said controlling means is responsive to the row address portions of said data access for selecting a common row of row and column address array location for the transfer of data between said first memory array and said second memory array.

6. The apparatus of claim 5 wherein a data transfer cycle is initiated by said controlling means in response to a predetermined first memory array data access address, said controlling means providing for the selection of data from one member of each pair of said data channels for provision to said serial data port at the conclusion of said data transfer cycle.

7. The apparatus of claim 2, 3, 4, 5 or 6 wherein said plurality of data channels include buffer means for receiving input data from said serial data port, said buffer means providing said input data to said decoding means, said controlling means providing for the enabling of said buffer means, said counter means and said decoding means for the transfer of said input data from said plurality of data channels to respectively selected column address array locations of said second memory array, said controlling means further providing for the parallel transfer of data stored in the column address array locations of said second memory array to a predetermined row of row and column address array location in said first memory array.

8. A data serializer system providing for the transfer of serial data with respect to a memory that is randomly accessible by a host processor, said data serializer system comprising:
  (a) a data memory array providing for the random access and storage of data;
  (b) a data line serializer including a serial data buffer having a plurality of static memory data storage locations and first and second data channels having respective first and second data sense stages and first and second data latch stages; and
  (c) a sequencer providing for control of the transfer of data between said data memory array and said serial data buffer and for the transfer of data to said first and second data channels from said serial data buffer, said memory load sequencer initiating a data transfer cycle in response to a host processor request including a data address, said sequencer including:
    (i) addressing means for enabling the transfer of data form said serial data buffer to said first and second data channels, respectively, said addressing means including first and second first and second data location address select latch stages, said first and second data location address select latch stages being coupled in series, said addressing means receiving said data address and forming data location addresses based on said data address, said addressing means sequentially providing said data location addresses to said first data location address select latch stage, the data location address latched by said second data location address select latch stage determining a data storage location of said serial data buffer for the transfer of data; and
    (ii) means for selectively enabling the sensing of data provided to said first and second data sense stages from said data storage location determined by the data location address latched by said second data location address select latch stage, said selectively enabling means further providing for selectively enabling said first and second data latch stages to latch the data sensed by said first and second data sense stages;
  said sequencer controlling said addressing means and said first and second data location address strobe latch stages during a data transfer cycle to respectively provide and successively latch data location address and for controlling said selectively enabling means to enable at least one of said data sensing stages upon completion of the transfer of data into said serial data buffer and for subsequently enabling the latching of respectively sensed data into said first and second data latch stages.

9. The data serializer system of claim 8 wherein said sequencer controls said addressing means to determine data location address whereby a plurality of data storage locations of said serial data buffer are selectively enabled for the transfer of respective data to said first and second data sensing stages and for subsequently enabling the latching of the respectively sensed data into said first and second data latch stages.

10. The data serializer system of claim 9 wherein said sequencer controls said addressing means to sequentially provide first and second data location addresses determined during a transfer cycle prior to completion of the transfer cycle.

11. The data serializer system of claim 10 wherein said data line serializer provides serialized data in synchronization with a clock signal and wherein said sequencer means controls said selectively enabling means for selecting either said first or said second data latch stage for providing data synchronously in advance of the first said clock signal following the transfer of data to said serial data buffer.

12. The data serializer system of claim 11 wherein said sequencer means controls said selectively enabling means for selecting said first and second data latch stages for providing data alternately from said first and second data latch stages in response to respective clock signals.

13. The data serializer system of claim 12 wherein said addressing means includes an address counter for receiving said data address and for providing incremented data address values as said data location addresses.

14. A data serializer for providing bidirectional serial data stream comprising:
- (a) a first memory array for storing data accessible by row and column addresses;
- (b) a second memory array for the static storing data accessible by respective column addresses;
- (c) a data transfer-gate array coupling said first and second memory arrays for the transfer of row data between said first and second memory arrays during a transfer cycle;
- (d) an address counter for receiving a predetermined column address at the beginning of a transfer cycle and for providing count values based on said predetermined column address;
- (e) a decoder coupled to said address counter for receiving counter values, said decoder providing a count value corresponding select signal on at least one of a plurality of decoder output lines;
- (f) a plurality of second memory array data location select circuits, each said select circuit being coupled to a corresponding one of said decoder output lines so as to be enabled by a respective said select signal;
- (g) first and second amplifiers coupled to said plurality of select circuits to sense data from respective data locations within respective portions of said second memory array;
- (h) first and second data latches respectively coupled to said first and second sense amplifiers so as to receive the data sensed thereof;
- (i) a multiplexer coupled to said first and second data latches for multiplexing the data received therefrom as the output data stream component of said bidirectional serial data stream; and
- (j) means for controlling the transfer of data to said second memory array, said controlling means providing for the enabling of said data transfer gate array, enabling the receiving of said column address by said address counter, enabling the decoder selection of a data location with in the first portion of said second memory array, enabling the self-generation of another count value by said address counter, enabling the decoder selection of a data location within the second portion of said second memory array, enabling said first and second sense amplifiers upon completion of the transfer of data into said second memory array, enabling the latching of the respectively sensed data into said first the second data latches and enabling the multiplexor selection of data from either said first or second data latch for provision from said data serializer upon completion of said data transfer cycle.

* * * * *